United States Patent
Meng et al.

(10) Patent No.: US 10,436,882 B2
(45) Date of Patent: Oct. 8, 2019

(54) ANALOG-TO-DIGITAL CONVERTERS FOR LIDAR SYSTEMS

(71) Applicant: Analog Devices Global Unlimited Company, Hamilton (BM)

(72) Inventors: Libo Meng, Shanghai (CN); Jun Mo, Shanghai (CN); Yu Liu, Shanghai (CN); Wei Wang, Shanghai (CN); Ke Yun, San Jose, CA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 406 days.

(21) Appl. No.: 15/353,955

(22) Filed: Nov. 17, 2016

(65) Prior Publication Data

US 2018/0306908 A1    Oct. 25, 2018

(51) Int. Cl.
| | |
|---|---|
| *G01S 7/48* | (2006.01) |
| *G01S 7/486* | (2006.01) |
| *H03M 1/36* | (2006.01) |
| *H03M 1/38* | (2006.01) |

(52) U.S. Cl.
CPC .......... *G01S 7/4861* (2013.01); *H03M 1/361* (2013.01); *H03M 1/38* (2013.01)

(58) Field of Classification Search
None
See application file for complete search history.

(56) References Cited

U.S. PATENT DOCUMENTS

| | | | |
|---|---|---|---|
| 7,830,442 B2 | 11/2010 | Griffis et al. | |
| 8,525,720 B2 | 9/2013 | Shah | |
| 2003/0018442 A1* | 1/2003 | Yamaguchi | G06F 17/15 |
| | | | 702/69 |
| 2003/0031284 A1* | 2/2003 | Ishida | G01R 31/31725 |
| | | | 375/371 |
| 2004/0243659 A1* | 12/2004 | Nikitin | G06G 7/02 |
| | | | 708/819 |

(Continued)

OTHER PUBLICATIONS

Gulrej Ahmed et al., *A Variable Threshold Voltage CMOS Comparator for Flash Analog to Digital Converter*, International Journal of Computer Applications (0975-8887), vol. 88—No. 7, Feb. 2014, 4 pages.

(Continued)

*Primary Examiner* — Hovhannes Baghdasaryan (57) ABSTRACT

Embodiments of the present disclosure propose analog-to-digital conversion (ADC) systems particularly suitable for Light Detection and Ranging (LIDAR) implementations. An exemplary proposed ADC system is configured to determine whether an absolute value of an analog value is greater than a threshold, and, upon positive determination, assign a predetermined digital value as a digital value corresponding to the analog value, without proceeding with the analog-to-digital conversion of the analog value. Because the ADC system only proceeds with the analog-to-digital conversion, using an ADC, when the input analog value is smaller than the threshold, and otherwise the input analog value is simply assigned some predefined digital value, design complexity and power consumption of the system may be significantly reduced, compared to conventional ADCs used in LIDAR applications.

21 Claims, 7 Drawing Sheets

(56) References Cited

U.S. PATENT DOCUMENTS

| | | | |
|---|---|---|---|
| 2006/0098750 A1* | 5/2006 | Zhidkov | H04L 27/2647 375/260 |
| 2007/0121760 A1* | 5/2007 | Yang | H04L 27/2647 375/317 |
| 2008/0042746 A1* | 2/2008 | Kozak | H03F 1/32 330/251 |
| 2008/0226072 A1* | 9/2008 | Lee | G01S 13/0209 380/263 |
| 2012/0306671 A1* | 12/2012 | Kapusta | H03M 1/1057 341/110 |
| 2014/0132436 A1 | 5/2014 | Tai et al. | |
| 2015/0049231 A1* | 2/2015 | Chen | H04N 5/378 348/308 |
| 2015/0116695 A1 | 4/2015 | Bartolome et al. | |
| 2015/0188556 A1* | 7/2015 | Chen | H03M 1/188 341/153 |
| 2015/0280729 A1 | 10/2015 | Strode et al. | |
| 2016/0056828 A1* | 2/2016 | Ueki | H03M 1/002 341/155 |

OTHER PUBLICATIONS

DE Office Action issued in DE Patent Application Serial No. 10 2017 124 561.8 dated Jun. 29, 2018, 43 pages+3 pages of English Translation of the Office Action.

\* cited by examiner

ANALOG-TO-DIGITAL CONVERTERS FOR LIDAR SYSTEMS

CROSS-REFERENCE TO PRIORITY DATA

This application is a non-provisional application and claims benefit to PCT Application Serial No. PCT/CN16/102651 filed Oct. 20, 2016 entitled, "ANALOG-TO-DIGITAL CONVERTERS FOR LIDAR SYSTEMS", which is incorporated herein by reference in its entirety.

TECHNICAL FIELD OF THE DISCLOSURE

The present invention relates to the field of converters, in particular to analog-to-digital converters used in LIDAR systems.

BACKGROUND

Analog-to-digital converters (ADCs) are devices that convert an analog input signal to a digital output signal, e.g. for further digital signal processing. ADCs can be found in many electronics applications such as broadband communication systems, audio systems, receiver systems, etc., where ADCs translate analog electrical signals representing real-world phenomenon, e.g., light, sound, temperature or pressure, for data processing purposes. For instance, in light detection and ranging (LIDAR) systems, optical sensors such as e.g. photodetectors are provided for measuring light incident thereon, and these sensors may generate an analog signal. The analog signal would then be provided to an ADC as input to generate a digital output signal for further processing.

Designing an ADC is a non-trivial task because each application may have different needs in performance, power, cost and size. Improvements in an ADC design are always desirable.

OVERVIEW

Embodiments of the present disclosure provide ADC systems particularly suitable for LIDAR systems and featuring reduced design complexity and power consumption, compared to conventional ADCs used in LIDAR applications.

One aspect of the present disclosure provides a LIDAR system that includes a light source and a light sensor configured to implement time-of-flight measurements to determine distance information to one or more objects, and a sensor storage array configured to store analog values indicative of the light sensor readings. The LIDAR system further includes an ADC system for converting the analog values to digital values by determining whether an absolute value of an analog value of the plurality of analog values is greater than a threshold, and, upon positive determination, assigning a predetermined digital value as a digital value corresponding to the analog value, without proceeding with an analog-to-digital conversion of the analog value. Because an ADC system only proceeds with the analog-to-digital conversion, using a ADC, when the input analog value is smaller than the threshold and otherwise the input analog value is simply assigned some predefined digital value, power consumption and design complexity may be reduced substantially. Such a process of establishing the digital values for the plurality of analog values corresponding to light sensor readings is referred to herein as a "non-linear analog-to-digital conversion."

Another aspect of the present disclosure provides a method of operating a LIDAR system, in particular the method of implementing non-linear analog-to-digital conversion in a LIDAR system. The method includes obtaining an analog value indicative of a light intensity detected by a light sensor of a time-of-flight camera used in the LIDAR system, and determining whether an absolute value of the analog value is greater than a threshold. Upon negative determination (i.e. when the analog value is determined to be smaller than the threshold value), the method includes using an ADC, such as e.g. a successive approximation routine (SAR) ADC or a three-level flash ADC, to convert said analog value to a digital value, and providing the converted digital value as a digital value corresponding to said analog value. Upon positive determination (i.e. when the analog value is determined to be greater than the threshold value), the method includes assigning a predetermined digital value to said analog value without finishing, or even beginning, the analog-to-digital conversion of said analog value, and providing the predetermined digital value as the digital value corresponding to said analog value.

As will be appreciated by one skilled in the art, aspects of the present disclosure, in particular aspects of non-linear analog-to-digital conversion in LIDAR systems proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing LIDAR systems, ADCs, and/or controllers of LIDARs and ADCs, etc.) or be stored upon manufacturing of these devices and systems.

Other features and advantages of the disclosure are apparent from the following description, and from the claims.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Analog-to-Digital Converters (ADCs)

Analog to digital converters (ADCs) are electronic devices that convert a continuous physical quantity carried by an analog signal to a digital number that represents the quantity's amplitude (or to a digital signal carrying that digital number). The conversion involves quantization of the analog input signal, so conversion typically introduces a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

There are many types of ADC technologies such as flash, sigma-delta, SAR converters, etc. These different styles of converters may be used in combination. In some converter topologies, an input signal is sampled onto a capacitor or an array of capacitors commonly referred to as "sampling capacitors" prior to the analog to digital conversion taking place. During the sampling operation, charge is exchanged between the sampling capacitor(s) and a circuit driving the sampling capacitor(s) so that the sampling capacitor(s) are charged to a voltage corresponding to the value of the input signal at that time. The driving circuit typically has an impedance such that it takes time to charge and discharge the sampling capacitor to its correct voltage. Terms such as "acquisition/acquire phase" or "sampling phase" may be used to describe a phase, i.e. a time period, when sampling capacitor(s) connected to an input node at which the input signal is received are being charged to a voltage corresponding to the input voltage. In other words, "acquire phase" or "sampling phase" refer to a time period when sampling capacitor(s) are sampling an analog input signal in order to convert the analog input signal to a digital output signal. Terms "sampling" and "acquire phase" may be used interchangeably to refer to the action of one or more sampling capacitors connected to an input node sampling or acquiring an input signal during a certain time period. An acquire phase is followed, which may but does not have to be in immediate succession (i.e. may or may not be done consecutively), by a phase that is typically referred to as a "conversion phase," where an analog value of the input signal sampled on the sampling capacitor(s) is converted to a digital value by comparison of the charge accumulated on the sampling capacitor(s) with one or more reference voltage values. After acquisition and conversion phases for converting one analog input value are finished, processing described above is repeated for the next analog input value.

An ADC is usually defined by the following operating characteristics, typically provided as part of application requirements: its bandwidth (the range of frequencies of analog signals that can be properly converted to a digital signal), its resolution (the number of discrete levels that the maximum analog signal can be divided into and represented in the digital signal), its signal to noise (SNR) ratio (how accurately the ADC can measure signal relative to the noise the ADC introduces), and its dynamic range (the minimum resolvable step size and the ratio between the largest and smallest possible inputs). ADCs have many different designs, which can be chosen based on the operating characteristics required by different applications.

Basics of LIDAR Systems

LIDAR is an acronym for Light Detection And Ranging. In general, LIDAR refers to a surveying technology that measures distance information about an object by illuminating the object with laser light, detecting light reflected from the object, and using time-of-flight techniques to resolve the distance to the object based on the known speed of light and the amount of time it takes for the light to travel between from the LIDAR system to the object and back. LIDAR can also be used to determine depth and/or speed of the object. A LIDAR system may be seen as a system similar to a sonar system which uses sound waves or a radar system which uses radio waves to measure distances to objects, except that a LIDAR system uses light waves.

Figure 1:
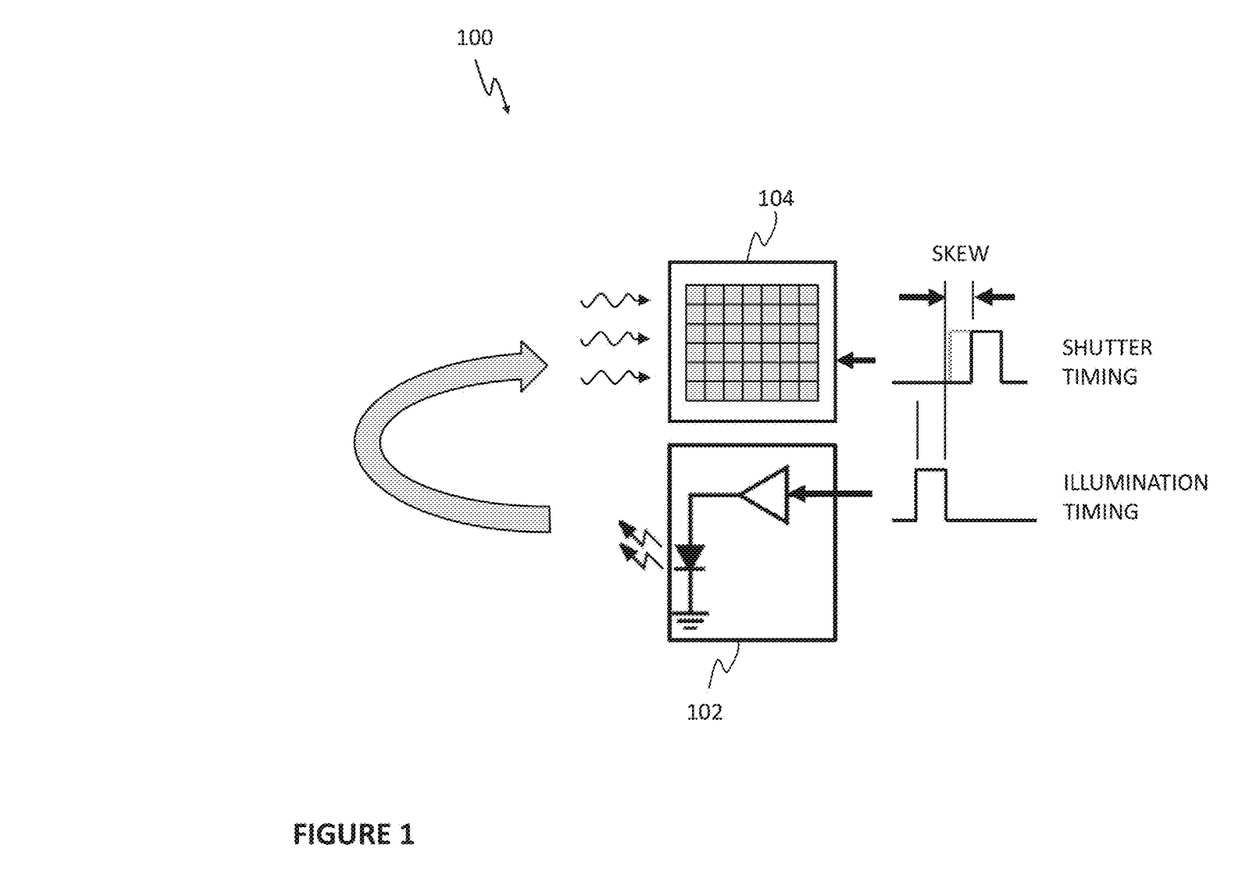
FIG. 1 illustrates an exemplary time-of-flight camera that could be used in a LIDAR system, according to some embodiments of the present disclosure.

FIG. 1 shows an exemplary time-of-flight system (referred to herein as a "time-of-flight camera") that could be used in a LIDAR system. The time-of-flight camera generally includes a light source 102 which can give off an active illumination pulse or light pulse, and a light sensor 104 with an electronic shutter. Although not shown, the time-of-flight camera would include a component that can compute the distance of an object in the field of view of the camera.

Typically, a time-of-flight camera measures scene depth by generating an active illumination pulse using the light source 102, where the illumination pulse reflects off an object in the scene, and by capturing the reflected light in the light sensor 104. The light source 102 may e.g. include a laser, a laser diode, a light emitting diode (LED), or any suitable component for emitting pulses of light with an intensity and within a range of wavelengths as suitable for a particular LIDAR implementation. For example, in some embodiments, the light source 102 may emit light with wavelengths in a range between 600 to 2600 nanometers. The light sensor 104 may include a photodetector, e.g. a photodiode, or any suitable optical/light/image sensor, typically implemented with an electronic shutter, that can detect light pulses emitted by the light source 102.

For example, the light source 102 can be configured to pulse infrared light at the object in the scene, and reflected light can be captured by the light sensor 104 being implemented as e.g. a charge coupled device (CCD) light sensor array or any other suitable type of light sensor arrays. The light source 102 may be driven by an electrical pulse which causes the light source 102 to flash. The shutter driver of the light sensor 104 may be driven by an electrical pulse which causes the shutter to open to allow an image to be captured and/or an image signal to be generated.

In some embodiments, the light source 102 and the light sensor 104 can be provided separately, or the light source 102 can be biased to function as the light sensor 104. In some embodiments, both the light source 102 and the light sensor 104 can be provided nearby each other in a housing or member of the time-of-flight camera 100 or in any suitable configuration where the light sensor 104 can measure reflections of the light emitted by the light source 102.

Note that the round trip time of the light traveling from the light source 102 to the object and from the object to the light sensor 104 would vary based on the distance of the object from the time-of-flight camera. Also, the speed of light is known. Therefore, depending on the distance between the object to the time-of-flight camera, the reflected light hitting the light sensor 104 would have a delay with respect to the time the light source 102 generated the light. Based on this information, it is possible to coordinate the phases of the light source 102 and the shutter driver of the light sensor 104 to capture the reflected light. By triggering pulses to the light source 102 and light sensor 104 with multiple timing phase differences, those phase differences and captured image signals from the light sensor 104 can be directly used to calculate the distance of the object from the camera. One skilled in the art would appreciate that there are several suitable techniques/algorithms that can be used for the time-of-flight camera to determine distance (e.g., techniques which leverages the known phase difference between the illumination and shutter pulses).

Figure 2:
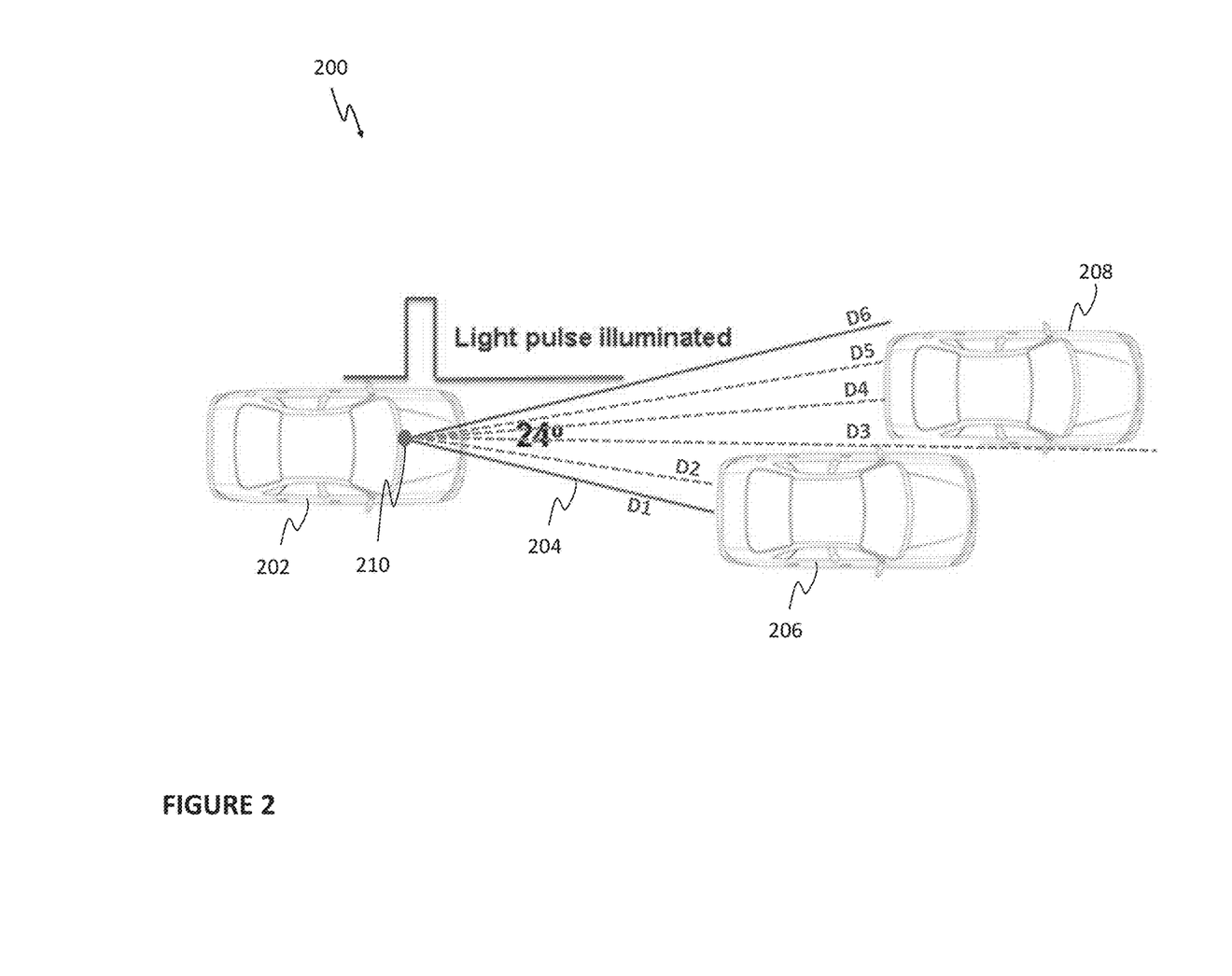
FIG. 2 illustrates an environment in which a LIDAR system may operate, according to some embodiments of the present disclosure.

Recently, LIDAR systems have been considered by automotive industry for use in vehicles for determining distances to other vehicles or, in general, other objects. FIG. 2 illustrates an exemplary environment 200 in which a LIDAR system of a vehicle 202 may operate, according to some embodiments of the present disclosure (the LIDAR system of the vehicle 202 is not specifically shown in FIG. 2). The LIDAR system of the first vehicle 202 may include a time-of-flight camera, e.g. the time-of-flight camera 100 shown in FIG. 1.

The LIDAR system of the first vehicle 202, in particular the light source of the time-of-flight camera of the LIDAR system, emits light pulses by scanning the light pulses across a field of view 204 of the LIDAR system, as illustrated for the example of FIG. 2. In other words, the light source of the time-of-flight camera of the LIDAR system of the first vehicle 202 emits light pulses in different directions across a certain field of view. For example, a field of view may be between 20 and 180 degrees, including all values and ranges therein, e.g. 34 degrees. By analyzing light detected by the light sensor of the time-of-flight camera of the LIDAR system at the first vehicle 202 (which detected light may include contributions from the light pulses emitted by the light source of the time-of-flight system and reflected from objects), distances to objects, e.g. distances to vehicles 206 and 208, may be determined.

More specifically, the light source of the LIDAR system at the first vehicle 202 emits one or more light pulses when the light source is facing a particular first direction, e.g. a direction shown in FIG. 2 with a solid line labeled D1, and the light sensor of the LIDAR system detects light incident thereon. For the example of FIG. 2, the light pulses emitted in the direction D1 will be reflected from the second vehicle 206 and will be sensed by the light sensor of the LIDAR system in the vehicle 202. The light source at the first vehicle then changes its direction to a direction shown in FIG. 2 with a dashed line labeled D2, emits one or more light pulses in that direction, and the light sensor of the LIDAR system again detects light incident thereon, which, for the example of FIG. 2, will again include the light pulses reflected from the second vehicle 206. At some point, the light source may change its direction of emitting light to a direction shown in FIG. 2 with a dashed line labeled D3, and emit one or more light pulse in that direction. This time, because direction D3 happens to be between the two vehicles 206 and 208, provided there are no other objects encountered by the light pulses further down within a certain range of distances, the light detected by the light sensor of the LIDAR system of the first vehicle 202 at that time may not include any contributions from the light pulse(s) emitted in the direction D3. In such a situation, some light will typically still be detected by the light sensor, e.g. ambient light, resulting in sensor readings which may then regarded as noise. Similarly, the light pulses emitted in the directions shown with dashed lines D4 and D5, will be reflected from the third vehicle 208 and these reflections will be detected by the light sensor of the LIDAR system in the first vehicle 202, while the light pulses emitted in the direction D6 shown with a solid line, will result in noise readings of the light sensor.

The sensor readings corresponding to each direction of the light source may be stored in a suitable array of memory elements, e.g. as voltage across a capacitor in a capacitor array. Thus, six capacitors C1-C6 may be used (not shown in FIG. 2) within the LIDAR system in the vehicle 202 for storing voltages indicative of the light detected by the light sensor when the light source emits light in each of the directions D1-D6. In addition, the analog sensor readings indicative of the amount of current generated by a photodiode, as an exemplary light sensor of a LIDAR system, are converted by one or more ADCs to digital values for further processing. Such "further processing" includes determination of distance information to various objects, e.g. determination of presence of objects within a certain range of distances, determination of distances to such objects, determination of speeds of various objects, etc.

The description of a LIDAR system provided above with reference to FIG. 2 are purely illustrative for showing a general concept. Different implementations may include many different variations, all of which are within the scope of the present disclosure. For example, in each direction of a light source of a time-of-flight camera of the LIDAR system, more than one light pulse may be emitted and sensor readings corresponding to each direction of a light source may be averaged or combined in any other manner which may result in improved sensor readings. In another example, in various other embodiments, field of views other than the one shown in FIG. 2 may be used for scanning the light pulses, and increments other than those shown in FIG. 2 with directions D1-D6 may be used (i.e. a time-of-flight camera of the LIDAR system of the first vehicle 202 may emit and detect light pulses in more, typically much more, than the six directions D1-D6 shown in FIG. 2). In yet another example, the time-of-flight camera of the LIDAR system may be installed in a different position on a vehicle as the one shown with a position 210 in FIG. 2, e.g. the time of-flight camera may be installed at the very front (e.g. at the front bumper) of the vehicle 202.

Figure 3:
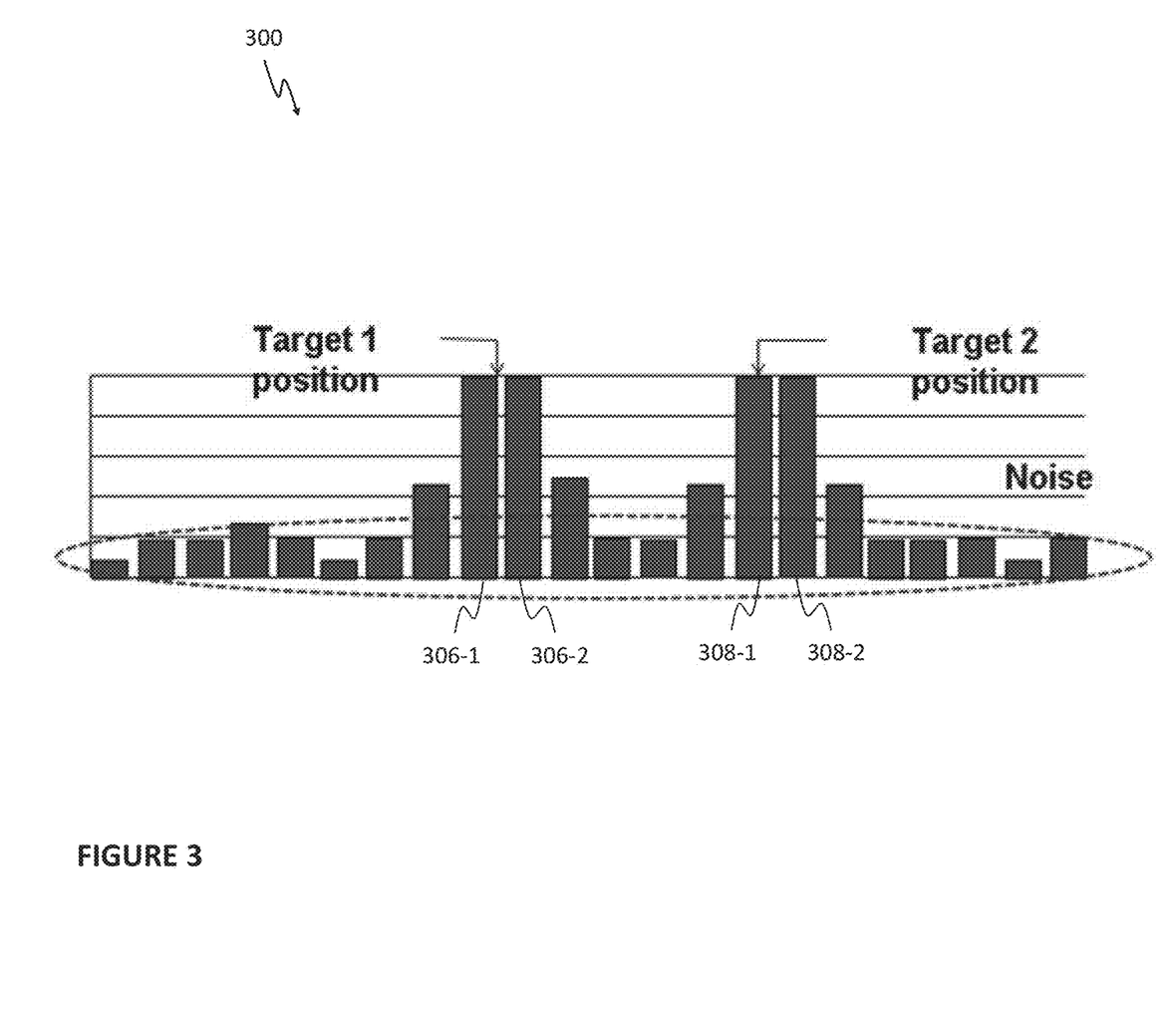
FIG. 3 illustrates exemplary readings of a light sensor of a LIDAR system, according to some embodiments of the present disclosure.

FIG. 3 illustrates exemplary readings of a light sensor of a LIDAR system, e.g. readings as can be acquired by the light sensor 104 of the LIDAR system of the first vehicle 202. More specifically, FIG. 3 illustrates that for some directions of the light source of the time-of-flight camera of a LIDAR system, in particular for the directions corresponding to sensor readings labeled in FIG. 3 as readings 306-1 and 306-2 and readings 308-1 and 308-2, the light sensor detects significantly more light than for other directions. The LIDAR system may then be configured to identify sensor readings corresponding to these directions as indicative of a presence of a target object and determine position of a target object based on these readings. For example, readings 306-1 and 306-2 may correspond to light sensor readings when the light source in the LIDAR system of the vehicle 202 shown in FIG. 2 emits light pulses in the directions D1 and D2, while readings 308-1 and 308-2 may correspond to light sensor readings when the light source in the LIDAR system of the vehicle 202 shown in FIG. 2 emits light pulses in the directions D4 and D5. The "target position 2" labeled in FIG. 3 may then indicate position of the second vehicle 206 shown in FIG. 2, while the "target position 3" labeled in FIG. 3 may then indicate position of the third vehicle 208 shown in FIG. 2. Sensor readings below a certain level may be considered as noise, as illustrated in FIG. 3 with a dashed oval labeled "Noise" circling some such smaller sensor readings.

The description provided above illustrates that a LIDAR system can quickly become quite complicated. For example, in implementations suitable for city-driving scenarios, a vehicle LIDAR system may be required to be able to detect objects in a range between e.g. 40 centimeters to 40 meters from a vehicle carrying the LIDAR system, with e.g. a 40 centimeter resolution of the LIDAR system, and with ADC dynamic range being 80 decibel (dB). For such a system, a 2.25 Million Samples per second (MSps) 26-bit delta sigma ADC may be used. Because people's safety depends on being able to accurately measure distances from vehicles to other objects, a conventional approach has been to not save on the ADCs employed in LIDAR systems. As a result, higher resolution, higher power, lower SNR ADCs have typically marked the way that the design of LIDAR systems has been evolving. Any attempts to improve on various operating characteristics of such ADCs have typically been along the lines of coming up with smart but complicated ADC architectures for high-resolution ADCs and techniques for operating high-resolution ADCs. Having automotive LIDAR systems with ADCs which are extremely demanding in terms of power consumption and processing resources has, conventionally, been viewed as an acceptable cost because human safety is at stake.

Contrary to this conventional wisdom, inventors of the present disclosure realized that features unique/specific to LIDAR systems may advantageously be used to make ADCs implemented in such systems significantly simpler and less power-consuming. In particular, inventors of the present disclosure realized that, since in LIDAR applications, sensor readings are primarily analyzed to merely distinguish signal from noise, certain requirements for very accurate signal conversion can be relaxed. In particular, sensor readings above a certain threshold may be considered as indicative of a presence of a target object. In such situations, the exact value of a sensor reading may not be so important, in which case it may be possible to skip resource- and power-intensive analog-to-digital conversion altogether and, instead, just assign a certain digital value representative of such a signal value. On the other hand, if a sensor reading is relatively small, then sensor signal may be amplified prior to analog-to-digital conversion, in order to improve the SNR of an ADC system used in LIDAR. Following this approach, it may be possible to e.g. implement a 22-bit ADC for scenarios which previously demanded 26-bit ADCs, thereby providing significant advantages in terms of power consumption, speed of operation, and design complexity.

Figure 4:
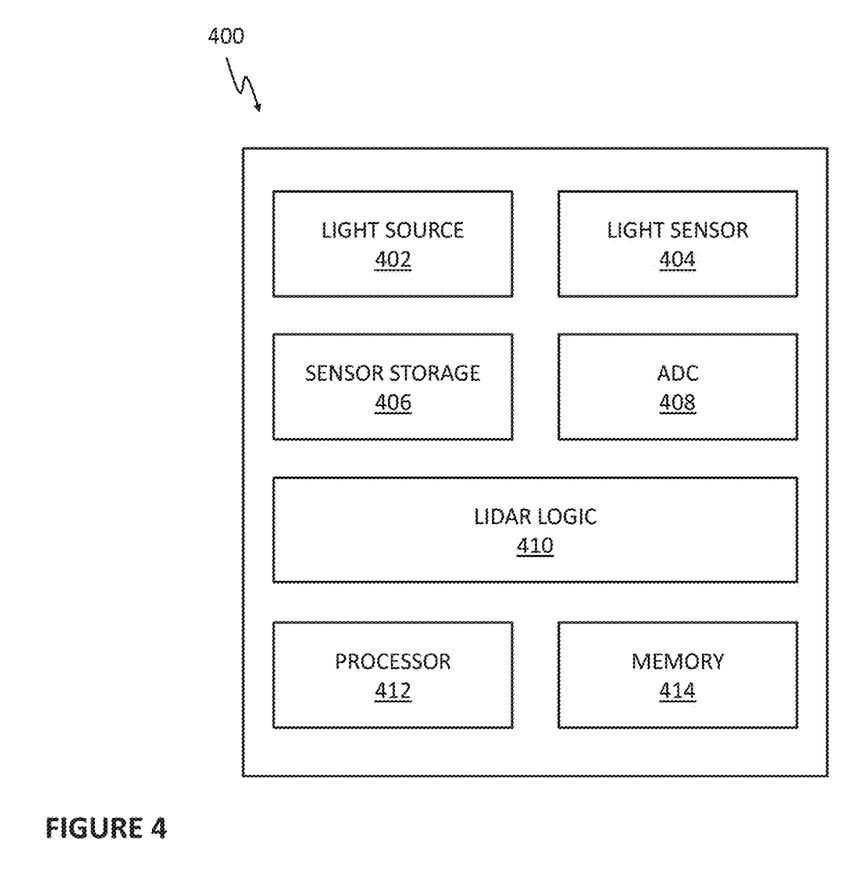
FIG. 4 illustrates an exemplary LIDAR system, according to some embodiments of the present disclosure.

FIG. 4 illustrates an exemplary LIDAR system 400 configured to implement non-linear analog-to-digital conversion, according to some embodiments of the present disclosure. The LIDAR system 400 may be implemented as the LIDAR system of the first vehicle 200, described above.

As shown in FIG. 4, the LIDAR system 400 may include at least one light source 402, at least one light sensor 404, at least one sensor storage 406, and at least one ADC 408. As also shown in FIG. 4, the LIDAR system 400 may further include a LIDAR logic 410, at least one processor 412, and at least one memory element 414.

The light source(s) 402 and the light sensor(s) 404 may include, respectively, light sources and sensors such as the light source 102 and the light sensor 104, described above, configured to operate in accordance with the time-of-flight principles described herein. In the interests of brevity, these descriptions are not repeated here.

The sensor storage 406 may include any array of storage elements configured to store values indicative of the readings of the light sensor 404 for various directions of illumination pulses emitted by the light source 402. In some embodiments, the sensor storage 406 may include an array of capacitors, where voltage on each capacitor is indicative of the light reading of the light sensor 404 for a particular direction of the light source 402.

The ADC 408 may include any suitable analog-to-digital converter for converting those analog input values which were determined by the LIDAR logic 410 as needed to be converted, as described in greater detail below.

The LIDAR logic 410, which may be implemented in hardware, software, firmware, or any suitable combination of the one or more of these, is configured to control the implementation of non-linear analog-to-digital conversion in the LIDAR system 400, a described herein. To that end, the LIDAR logic 410 may include at least one processor 412 and at least one memory element 414, along with any other suitable hardware and/or software to enable its intended functionality of analog-to-digital conversion in a LIDAR system as described herein. In some embodiments, the processor 412 can execute software or an algorithm to perform the activities as discussed in this Specification, e.g. the processor 412 can execute the algorithms that trigger comparison of input analog values with one or more thresholds as described herein, e.g. with reference to FIG. 5. Thus, although shown as separate elements in FIG. 4, the processor 412 and/or the memory 414 may be considered to be a part of the LIDAR logic 410.

The processor 412 may be configured to communicatively couple to other system elements via one or more interconnects or buses. Such a processor may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (ASIC), or a virtual machine processor. The processor 412 may be communicatively coupled to the memory element 414, for example in a direct-memory access (DMA) configuration. Such a memory element may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory items discussed herein should be construed as being encompassed within the broad term "memory element." The information being tracked or sent to the LIDAR logic 410, the light source 402, the light sensor 404, the sensor storage 406, the processor 412, or the memory 414 could be provided in any database, register, control list, cache, or storage structure, all of which can be referenced at any suitable timeframe. Any such storage options may be included within the broad term "memory element" as used herein. Similarly, any of the potential processing elements, modules, and machines described herein should be construed as being encompassed within the broad term "processor." Each of the elements shown in FIG. 4, e.g. the LIDAR logic 410 and the light sensor 404, can also include suitable interfaces for receiving, transmitting, and/or otherwise communicating data or information in a network environment.

In certain example implementations, mechanisms for non-linear analog-to-digital conversion in LIDAR systems as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory 414 shown in FIG. 4, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 412 shown in FIG. 4, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

Figure 5:
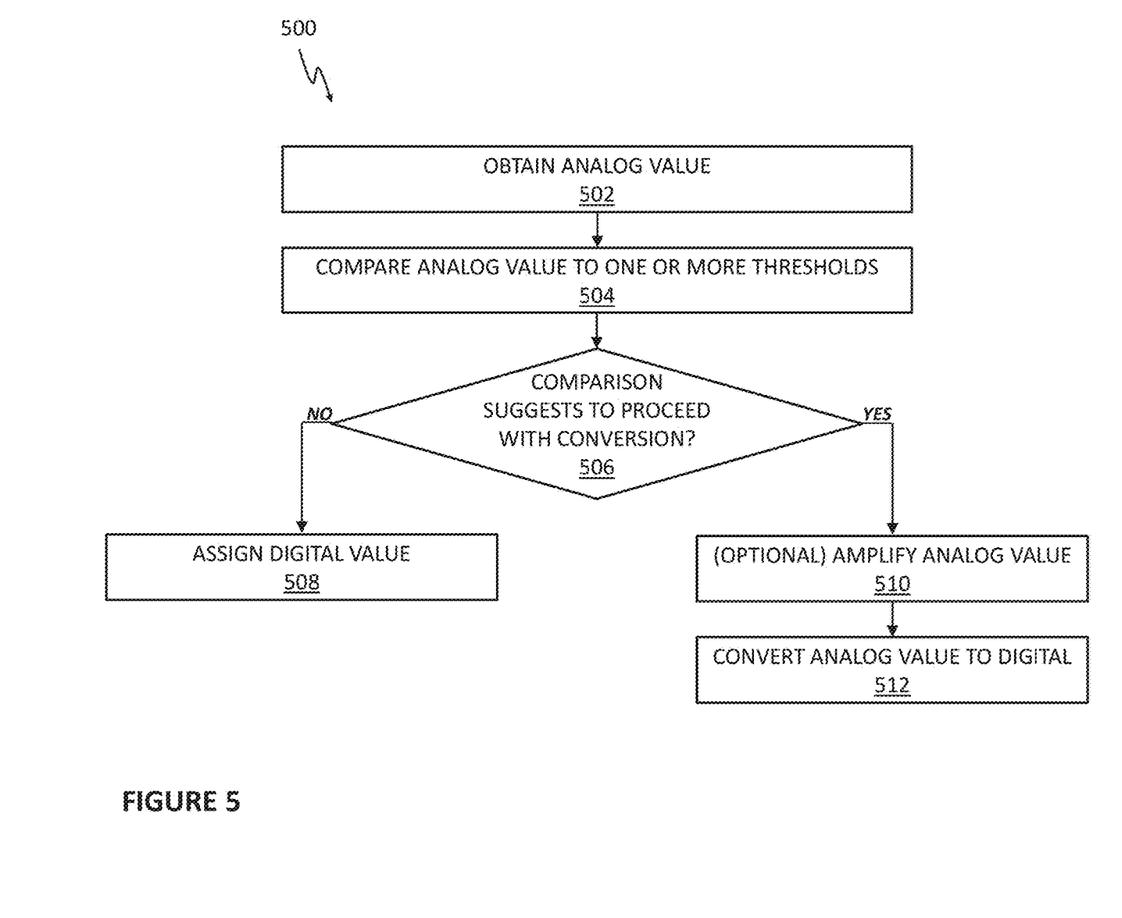
FIG. 5 illustrates a flow diagram of method steps for non-linear analog-to-digital conversion in a LIDAR system, according to some embodiments of the present disclosure.

FIG. 5 illustrates a flow diagram of a method 500 for non-linear analog-to-digital conversion in a LIDAR system, according to some embodiments of the present disclosure. Although described with reference to the elements of the LIDAR system 400 shown in FIG. 4, any system, configured to implement steps of the method 500, in any order, is within the scope of the present disclosure.

The method 500 may be implemented in context of the LIDAR system 400 operating to determine distance information to various objects. As described above, in this context, the light source 402 emits pulses of lights in different directions and the light sensor 404 detects light, where the detected light may include contributions of the pulses of light emitted by the light source 402 and reflected from the objects. The sensor storage 406, implemented e.g. as a plurality of capacitors, stores a plurality of analog values indicative of the sensor readings of the light sensor 404 (i.e. indicative of the contributions of the pulses of light reflected from one or more objects). An ADC system of the LIDAR system 400, which may be seen as including the ADC 408 and the LIDAR logic 410, then implements the method 500 for determining digital values corresponding for the analog values stored in the sensor storage 406.

The method may begin with step 502, where the ADC system, e.g. the LIDAR logic 410, obtains an analog value, of the plurality of analog values stored in the sensor storage 406, for which a corresponding digital value is to be determined.

In step 504, the LIDAR logic 410 compares the received analog value to one or more thresholds to determine whether the absolute value of this analog value is greater than any of the thresholds. The purpose of this step is to determine whether the ADC system should proceed with the actual conversion of the analog value using the ADC 408 or whether the analog value is sufficiently large to quality as a "peak" in the LIDAR readings and to be able to skip the conversion by simply assigning a predefined digital value to it.

In the simplest form, step 504 may include comparison of the received analog value to a single threshold. The analog value being larger than such a threshold is then interpreted, by the LIDAR logic 410, in step 506, as an indication that there is no need to proceed with the conversion. In this case, the method 500 proceeds to step 508 where the LIDAR logic 410 assigns a predefined digital value to the analog value obtained in step 502, without proceeding with the actual conversion of the analog value by the ADC 408 (i.e. the ADC 408 does not have to be engaged and may e.g. be put in an appropriate low-power mode). If, however, comparison of the analog value to the threshold reveals that the analog value is smaller than the threshold, then, in step 506, the LIDAR logic 410 determines that conversion by the ADC 408 is needed. In such a case, the method 500 proceeds with providing the analog value to the ADC 408 and the ADC 408 proceeding with analog-to-digital conversion to convert the analog value to a digital value, as shown in FIG. 5 with step 512. Optionally, the analog value may be amplified prior to the ADC 408 converting the value, as shown in FIG. 5 with step 510 preceding the conversion step 512. In such embodiments, the ADC 408 is configured to proceed with a conversion of an amplified analog value.

In slightly more complicated embodiments, step 504 may include comparison of the received analog value to more than one thresholds. Each of such thresholds may be associated with a different digital value. If the comparison reveals that the analog value is larger than any of the plurality of thresholds, the LIDAR logic 410 would interpret, in step 506, that there is no need to proceed with the conversion by the ADC 408.

In such a case, in some embodiments, the LIDAR logic 410 may be configured to e.g. assign a predefined digital value associated with the largest threshold of the plurality of thresholds which was determined to be smaller than the analog value.

Consider an example with three thresholds, T1, T2, and T3, such that T1<T2<T3, and three digital values D1, D2, and D3 associated with the thresholds T1, T2, and T3, respectively. Consider also that the comparison of step 504 reveals that the analog value obtained in step 502 is greater than both T1 and T2 but less than T3. In such a case, the LIDAR logic 410 would assign, in step 508, the digital value D2 to the analog value obtained in step 502, because the threshold T2 is the largest threshold which is smaller than the analog value (since in this example T2 is larger than T1, and T3 is not smaller than the analog value).

In other embodiments where there is a plurality of thresholds associated with different digital values, comparison of step 504 may begin with a comparison of the analog value with the largest threshold. If the comparison reveals that the analog value is larger than this largest threshold, then comparisons with further threshold(s) do not have to be performed and a digital value corresponding to the largest threshold is assigned to the analog value in step 508. If, however, the comparison of step 504 reveals that the analog value is smaller than the largest threshold, then the analog value may be compared to the second largest threshold, where, if the comparison reveals that the analog value is larger than the second largest threshold, then comparisons with further thresholds, if any, do not have to be performed and a digital value corresponding to the second largest threshold is assigned to the analog value in step 508, and so on.

Consider an example with three thresholds, T1, T2, and T3, such that T1<T2<T3, and three digital values D1, D2, and D3 associated with the thresholds T1, T2, and T3, respectively. Consider also that the comparison of step 504 begins with comparison of the analog value obtained in step 502 with the largest threshold, T3, and reveals that the analog value is less than T3. In such a case, the comparison of step 504 continues with comparing the analog value with the second largest threshold, T2. If such a comparison reveals that the analog value is greater than T2, then the LIDAR logic 410 would assign, in step 508, the digital value D2 to the analog value obtained in step 502, because this is the digital value corresponding to threshold T2.

The digital value obtained as a result of implementing the method 500, the digital value being either assigned in step 508 or converted in step 512, may then be stored as a digital value corresponding to the analog value obtained in step 502. The method 500 may be repeated for all analog values stored in the sensor storage 406 for which corresponding digital values need to be determined.

Figure 6:
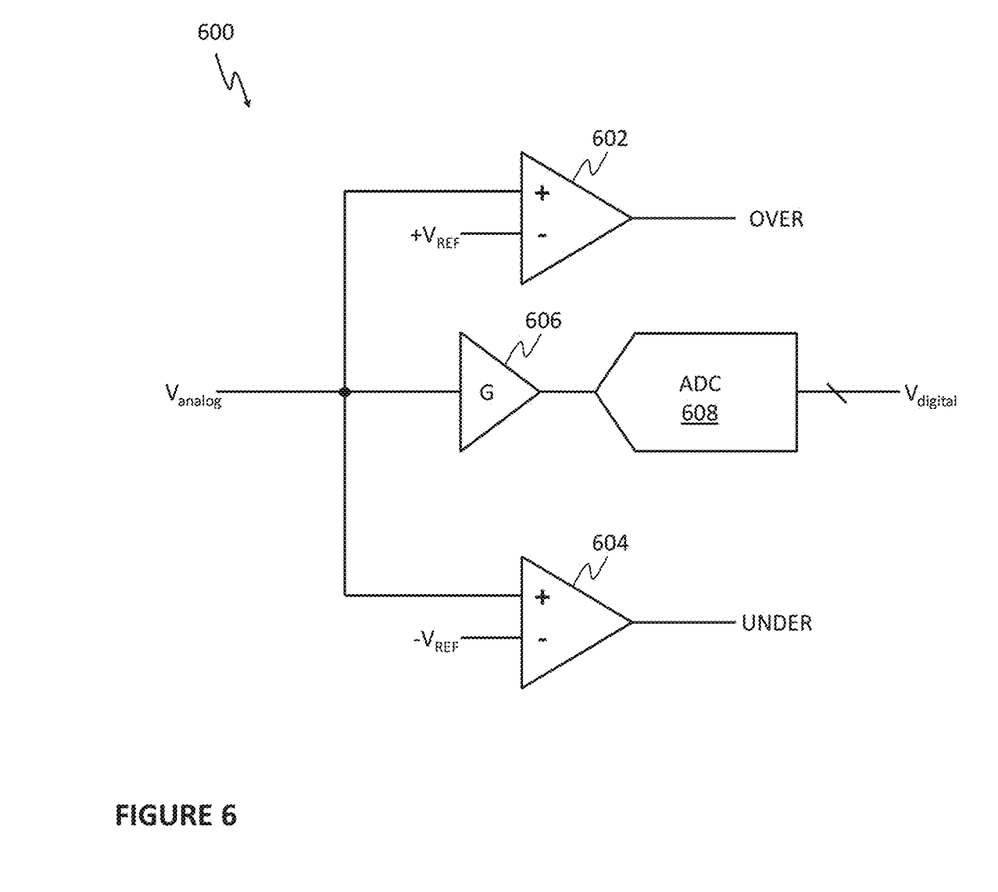
FIG. 6 illustrates an exemplary ADC system for non-linear analog-to-digital conversion in a LIDAR system, according to some embodiments of the present disclosure.

FIG. 6 illustrates an exemplary ADC system 600 for non-linear analog-to-digital conversion in a LIDAR system, according to some embodiments of the present disclosure. The ADC system 600 may be used to implement functionality of the ADC systems described herein, e.g. to implement the functionality of the ADC 408 and the LIDAR logic 410 described above.

FIG. 6 illustrates that the ADC system 600 may include comparators 602 and 604, an amplifier 606 having a gain G, and an ADC 608. $V_{analog}$ shown in FIG. 6 indicates analog voltage value to be translated to a corresponding digital value $V_{digital}$, also shown in FIG. 6. Reference value $V_{REF}$ shown in FIG. 6 indicates a threshold value to which the incoming analog value $V_{analog}$ is compared to. As shown in FIG. 6, the positive and negative values of the threshold voltage $V_{REF}$ are provided to comparators 602 and 604, respectively. In combination, the comparators 602 and 604 allow determining whether an absolute value of the incoming analog value $V_{analog}$ is greater than the threshold voltage $V_{REF}$. When this is the case, one of the comparators 602 and 604 will have a value of 1 at its' output (i.e. either OVER=1 or UNDER=1). The outputs OVER and UNDER of the comparators 602 and 604 may be provided to the LIDAR logic 410 and, when either one of these signals is 1, the LIDAR logic 410 may instruct the ADC 608 to not perform the conversion of the input value $V_{analog}$, and, instead, assign a predefined digital value corresponding to the threshold voltage $V_{REF}$. In some embodiments, in this case the LIDAR logic 410 may also instruct the amplifier 606 to not amplify the input value $V_{analog}$.

As an example, by implementing the non-linear analog-to-digital conversion as described herein, deployment scenarios which previously required implementing a 16-bit ADC with 13-bit Effective Number Of Bits (ENOB) may now be implemented with a 12-bit ADC with 9-bit ENOB as the ADC 608, when selecting $\pm V_{REF}=\pm V_{FS}$ (where $V_{FS}$ is the full-scale range of the ADC system), and G of the amplifier 606 being equal to 16. In such an example, power consumption can be reduced to be about 30% of that of previous implementations.

According to further embodiments, the ADC used for implementing the conversion in a LIDAR system, e.g. the ADC 408 or the ADC 608 illustrated in the FIGUREs, may also be designed to have non-linear threshold. In case such an ADC is implemented as a successive approximation routine (SAR) ADC, this may be implemented by varying the weight of various sampling capacitors, as illustrated in FIG. 7.

Figure 7:
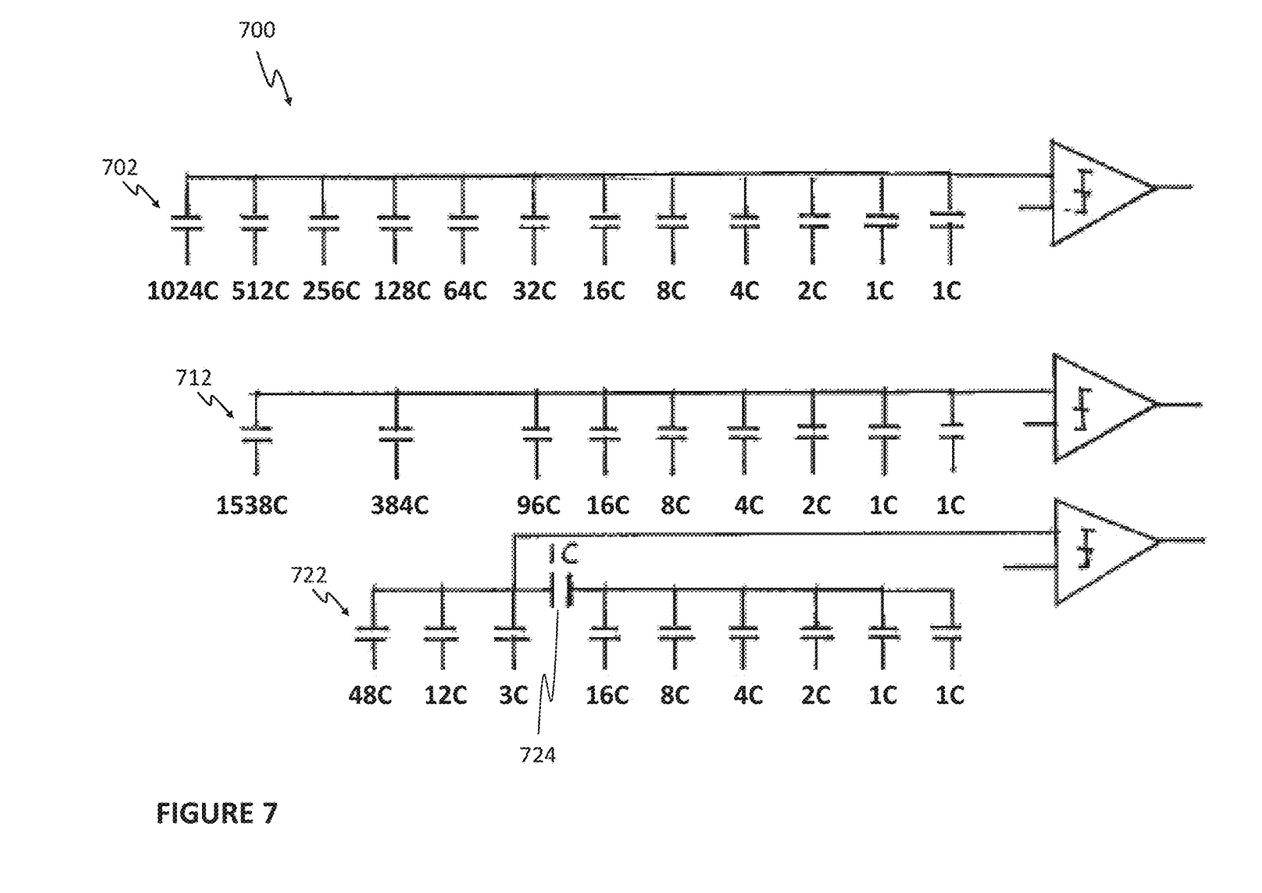
FIG. 7 illustrates examples of sampling capacitor arrays for an ADC, according to some embodiments of the present disclosure.

FIG. 7 illustrates examples of three sampling capacitor arrays for a 12-bit SAR ADC, according to some embodiments of the present disclosure. As is known in the art, conversion by a SAR ADC begins an input signal being sampled onto an array of capacitors, referred to as "sampling capacitors," in a so-called "acquire phase" of the conversion of the input signal. An acquire phase is followed by the "conversion phase" during which the charge on the sampling capacitors is translated to an output digital value by an integrator. Typically, the array of sampling capacitors includes binary-weighted capacitors, as is shown with the first capacitor array 702 shown in FIG. 7, with the weights of the 12 sampling capacitors (for the example of a 12-bit SAR ADC) being binary weights, shown, from right (LSB capacitors) to the left (MSB capacitors) as 1C, 1C, 2C, 4C, 8C, etc.

On the other hand, the ADC used for implementing the conversion in a LIDAR system may be implemented with some MSB sampling capacitors being grouped together to make the threshold for the conversion non-linear. An example of this, for the 12-bit SAR ADC is shown with a sampling array 712 where the two MSB sampling capacitors of the array 702 (i.e. capacitors 1024C and 512C) are combined into one sampling capacitor 1538C in the array 712, where the next two MSB sampling capacitors of the array 702 (i.e. capacitors 256C and 128C) are combined into one sampling capacitor 384C in the array 712, and where, finally, the next two MSB sampling capacitors of the array 702 (i.e. capacitors 64C and 32C) are combined into one sampling capacitor 96C in the array 712. The remaining sampling capacitors in the array 712 are binary weighted.

SAR ADC, with binary or non-binary weighted MSB sampling capacitors, is particularly advantageous for implementing embodiments of the non-linear analog-to-digital conversion described herein because when the MSB result is 1 for a positive input voltage or 0 for a negative input, conversion may be stopped (i.e. the SAR ADC does not have to proceed to the conversion phase) because such an MSB result indicates that the input signal is larger than a certain threshold.

A sampling array 722 shown at the bottom of FIG. 7 illustrates that, when MSB capacitors are combined as shown in the array 712, a bridge capacitor 724 may be used in order to advantageously reduce the size of the MSB capacitors. The example shown in FIG. 7 illustrates that using the bridge capacitor 724 of weight 1C connected to three MSB sampling capacitors which are non-binary weighted allows using smaller weights for the MSB capacitors—instead of capacitors 1538C, 384C, and 96C used as shown in the array 722, in the array 724 the MSB capacitors have weights of 48C, 12C, and 3C, respectively.

Variations and Implementations

In the discussions of the embodiments above, the light sources and sensors, capacitors, comparators, amplifiers, switches, digital core, transistors, and/or other components can readily be replaced, substituted, or otherwise modified in order to accommodate particular circuitry needs implementing non-linear analog-to-digital conversion in a LIDAR system. Moreover, it should be noted that the use of complementary electronic devices, hardware, software, etc. offer an equally viable option for implementing the teachings of the present disclosure.

In one example embodiment, any number of electrical circuits for implementing non-linear analog-to-digital conversion in a LIDAR system, described herein, may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities of non-linear analog-to-digital conversion in a LIDAR system described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that various embodiments related to non-linear analog-to-digital conversion in a LIDAR system described herein may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the non-linear analog-to-digital conversion functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships related to non-linear analog-to-digital conversion in a LIDAR system outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with converting an analog signal to a digital signal and processing such digital signal. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems utilizing analog-to-digital conversion. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision or high-speed data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the non-linear analog-to-digital conversion discussed above can be used for products related to image processing.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a larger number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to non-linear analog-to-digital conversion in a LIDAR system illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

Parts of various apparatuses for non-linear analog-to-digital conversion in a LIDAR system as described herein can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that all optional features of the apparatus described above may also be implemented with respect to the method or process described herein and specifics in the examples may be used anywhere in one or more embodiments.

What is claimed is:

1. A LIDAR system comprising:
   a light source configured to emit pulses of light;
   a light sensor configured to detect light comprising contributions of the pulses of light reflected from an object;
   a sensor storage array configured to store a plurality of analog values indicative of the contributions of the pulses of light reflected from the object;
   an analog-to-digital converter (ADC) system provided with a predetermined multi-bit digital value and configured to convert at least one analog value of the plurality of analog values to a multi-bit digital value by:
      determining whether an absolute value of the at least one analog value is greater than a threshold,
      upon positive determination, assigning the predetermined multi-bit digital value as the digital value corresponding to the at least one analog value without proceeding with an analog-to-digital conversion of the analog value to generate one or more bits of the digital value, and
      upon negative determination, proceeding with the analog-to-digital conversion to convert the at least one analog value to the digital value; and
   a processor configured to determine at least one of a distance to and a speed of the object based on the digital value.

2. The LIDAR system according to claim 1, wherein:
   the threshold is one threshold of a plurality of thresholds, and the predetermined value is one predetermined value of a plurality of predetermined values corresponding to the plurality of thresholds,
   the determining comprises determining whether the absolute value of the analog value is greater than any of the plurality of thresholds, and
   the assigning upon positive determination comprises assigning a predetermined digital value corresponding to a largest threshold of the plurality of thresholds which is smaller than the absolute value of the analog value.

3. The LIDAR system according to claim 1, wherein the ADC system comprises a three-level flash ADC for implementing the analog-to-digital conversion.

4. The LIDAR system according to claim 1, wherein the ADC system comprises an amplifier to amplify the analog value prior to the analog-to-digital conversion.

5. The LIDAR system according to claim 1, wherein:
   the ADC system comprises a successive approximation routine (SAR) converter for implementing the analog-to-digital conversion;
   the SAR converter includes a plurality of sampling capacitors to sample the analog value in an acquire phase, and
   one or more of the plurality of sampling capacitors are non-binary weighted with respect to remaining sampling capacitors of the plurality of sampling capacitors.

6. The LIDAR system according to claim 5, wherein the one or more non-binary weighted sampling capacitors comprise one or more most significant bit (MSB) sampling capacitors.

7. The LIDAR system according to claim 5, further comprising a bridge capacitor connected to the one or more non-binary weighted sampling capacitors.

8. The LIDAR system according to claim 1, wherein the light source comprises a laser or a laser diode.

9. The LIDAR system according to claim 1, wherein the light sensor comprises a charge coupled device.

10. The LIDAR system according to claim 1, wherein the light source and the light sensor are configured to enable time-of-flight measurements.

11. A method for determining at least one of a distance to and a speed of an object based on an analog value indicative of one or more pulses of light reflected from the object, the method comprising:
   determining whether an absolute value of the analog value is greater than a threshold;
   upon negative determination, using an analog-to-digital converter (ADC) provided with a predetermined multi-bit digital value to convert the analog value to a multi-bit digital value and providing the converted multi-bit digital value as a digital value corresponding to the analog value;
   upon positive determination, assigning the predetermined multi-bit digital value to the analog value without finishing an analog-to-digital conversion for at least one bit of the multi-bit digital value and providing the predetermined multi-bit digital value as the digital value corresponding to the analog value; and
   determining the at least one of the distance to and the speed of the object based on the digital value corresponding to the analog value.

12. The method according to claim 11, wherein using the ADC comprises sampling the analog value on a plurality of sampling capacitors of the ADC during an acquire phase and subsequently converting voltages on the plurality of sampling capacitors to the digital value during a conversion phase.

13. The method according to claim 11, wherein:
the threshold is one threshold of a plurality of thresholds, and the predetermined value is one predetermined value of a plurality of predetermined values corresponding to the plurality of thresholds,
the determining comprises determining whether the absolute value of the analog value is greater than any of the plurality of thresholds, and
the assigning upon positive determination comprises assigning a predetermined digital value corresponding to a largest threshold of the plurality of thresholds which is smaller than the absolute value of the analog value.

14. The method according to claim 11, further comprising amplifying the analog value prior to the analog-to-digital conversion.

15. The method according to claim 11, further comprising using a successive approximation routine (SAR) converter for implementing the analog-to-digital conversion, wherein:
the SAR converter includes a plurality of sampling capacitors to sample the analog value in an acquire phase, and
one or more of the plurality of sampling capacitors are non-binary weighted with respect to remaining sampling capacitors of the plurality of sampling capacitors.

16. The method according to claim 15, wherein the one or more non-binary weighted sampling capacitors comprise one or more most significant bit (MSB) sampling capacitors.

17. A system for determining at least one of a distance to and a speed of an object, the system comprising:
a sensor storage configured to store an analog value indicative of a contribution, as detected by a light sensor, of one or more pulses of light emitted by a light source and reflected from the object;
an analog-to-digital converter (ADC) system provided with a predetermined multi-bit digital value and configured to convert the analog value to a multi-bit digital value by:
determining whether an absolute value of the analog value is greater than a threshold,
upon negative determination, proceeding with an analog-to-digital conversion to convert the analog value to a multi-bit digital value, and
upon positive determination, assigning the predetermined digital value as a digital value corresponding to the analog value without performing the analog-to-digital conversion to determine at least one bit of the multi-bit digital value, and
and
a processor configured to determine the at least one of the distance to and the speed of the object based on the digital value.

18. A system for determining at least one of a distance to and a speed of an object based on an analog value indicative of one or more pulses of light reflected from the object, the system comprising:
an analog-to-digital converter (ADC); and
a processor configured to:
determine whether an absolute value of the analog value is greater than a threshold,
upon negative determination, use the ADC provided with a predetermined multi bit digital value to convert the analog value to a multi-bit digital value and provide the converted multi-bit digital value as a digital value corresponding to the analog value,
upon positive determination, assign the predetermined digital value to the analog value without performing an analog-to-digital conversion for at least one bit of the multi-bit digital value and provide the predetermined digital value as the digital value corresponding to the analog value, and
determine the at least one of the distance to and the speed of the object based on the digital value corresponding to the analog value.

19. The system according to claim 18, further comprising a light sensor configured to detect light that includes a contribution of the one or more pulses of light reflected from the object, wherein the analog value is indicative of the contribution.

20. The system according to claim 18, further comprising a light source configured to emit the one or more pulses of light to be reflected from the object.

21. The system according to claim 18, further comprising a sensor storage configured to store the analog value.

* * * * *